United States Patent
Hollenberg et al.

(10) Patent No.: US 10,830,717 B2
(45) Date of Patent: Nov. 10, 2020

(54) DETERMINING A SPATIAL CONFIGURATION OF MULTIPLE NUCLEI

(71) Applicant: The University of Melbourne, Parkville (AU)

(72) Inventors: Lloyd Hollenberg, Melbourne (AU); Viktor Perunicic, Melbourne (AU)

(73) Assignee: The University of Melbourne, Parkville (AU)

( * ) Notice: Subject to any disclaimer, the term of this patent is extended or adjusted under 35 U.S.C. 154(b) by 271 days.

(21) Appl. No.: 15/739,689

(22) PCT Filed: Jun. 30, 2016

(86) PCT No.: PCT/AU2016/050565
§ 371 (c)(1),
(2) Date: Dec. 22, 2017

(87) PCT Pub. No.: WO2017/000035
PCT Pub. Date: Jan. 5, 2017

(65) Prior Publication Data
US 2018/0195983 A1    Jul. 12, 2018

(30) Foreign Application Priority Data

Jun. 30, 2015    (AU) .............................. 2015902551

(51) Int. Cl.
*G01N 24/08*    (2006.01)
*G01R 33/46*    (2006.01)
*G01R 33/32*    (2006.01)

(52) U.S. Cl.
CPC ......... *G01N 24/087* (2013.01); *G01R 33/323* (2013.01); *G01R 33/46* (2013.01)

(58) Field of Classification Search
CPC ..... G01N 24/087; G01R 33/323; G01R 33/46
USPC ....................................................... 324/304
See application file for complete search history.

(56) References Cited

PUBLICATIONS

Extended European Search Report dated Feb. 25, 2019, for corresponding European Application No. 16816865.6.
Perunicic, V.S., et al., "A Quantum Spin-Probe Molecular Microscope," Nature Communications, Oct. 11, 2016, vol. 7, No. 1, DOI: 10.1038/ncomms12667.

(Continued)

*Primary Examiner* — Melissa J Koval
*Assistant Examiner* — Rahul Maini
(74) *Attorney, Agent, or Firm* — Nelson Mullins Riley & Scarborough LLP

(57) ABSTRACT

This disclosure relates to determining a spatial configuration of multiple nuclei. An electron dipole generates a spatially varying magnetic field such that each of the multiple nuclei is resonant at a respective resonance frequency defined by the magnetic field at a location of that nucleus. A first signal generator generates a first signal at a first signal frequency such that, as a result of dipole-dipole interaction between the electron dipole and a subset of the multiple nuclei that are resonant at the first signal frequency, a phase of the electron dipole is indicative of a number of nuclei that are resonant at the first signal frequency. A readout module determines the phase of the electron dipole, and determines the spatial configuration of the multiple nuclei based on the phase of the electron dipole. As a result of the high spatial resolution of the sensing the nuclear structure of molecules can be determined with low noise.

22 Claims, 9 Drawing Sheets

(56) References Cited

PUBLICATIONS

Muller, C. et al., 'Nuclear magnetic resonance spectroscopy with single spin sensitivity', Nature Communications, 2014, vol. 5:4703, pp. 1-6. DOI:10.1038/ncomms5703.

Perunicic, V. et al., 'Towards single-molecule NMR detection and spectroscopy using single spins in diamond', Physical Review B, 2014, 89 (5), pp. 054432-1 to 054432-7. DOI: 10.1103/PhysRevB.89.054432.

Mamin, H. et al., 'Nanoscale nuclear magnetic resonance with a nitrogen-vacancy spin sensor', Science, 2013, vol. 339 (6119), pp. 557-560. DOI: 10.1126/science.1231540.

Rugar, D. et al., 'Proton magnetic resonance imaging using a nitrogen-vacancy spin sensor', Nature Technology, Feb. 2015, vol. 10, pp. 120-124. DOI: 10.1038/nnano. 2014.228.

Staudacher, T. et al., 'Nuclear magnetic resonance spectroscopy on a (5-nanometer) 3 sample volume', Science, 2013, vol. 339 (6119), pp. 561-563. DOI: 10.1126/science.1231675.

Kost, M. et al., 'Resolving single molecule structures with nitrogen-vacancy centers in diamond', Scientific Reports, Jun. 5, 2015, vol. 5(11007), pp. 1-10. DOI: 10.1038/srep11007.

Grinolds, M. et al., 'Subnanometre resolution in three-dimensional magnetic resonance imaging of individual dark spins', Nature Nanotechnology, 2014, vol. 9(4), pp. 279-284. DOI: 10.1038/nnano.2014.30.

Hollenberg, L., 'Dark spins in the spotlight', Nature Nanotechnology, 2014, vol. 9, pp. 253-255.

International Search Report for PCT/AU2016/050565 dated Jun. 30, 2016.

Written Opinion for PCT/AU2016/050565 dated Jun. 30, 2016.

Ajoy, A. et al., 'Atomic-scale nuclear spin imaging using quantum-assisted sensors in diamond'. American Physical Society, Jan. 7, 2015, pp. 1-11. DOI: 10.1103/PhysRevX.5.011001.

Lazariev, A. et al., 'A nitrogen-vacancy spin based molecular structure microscope using multiplexed projection reconstruction'.

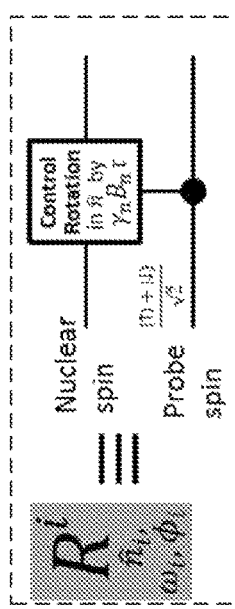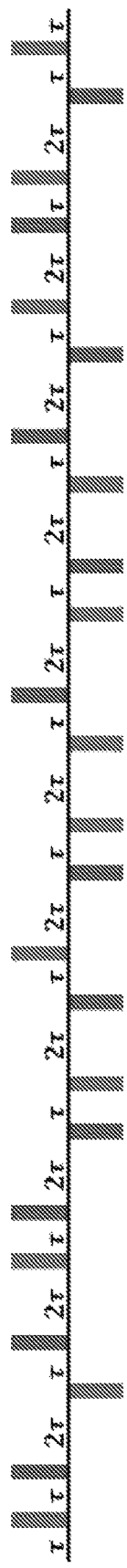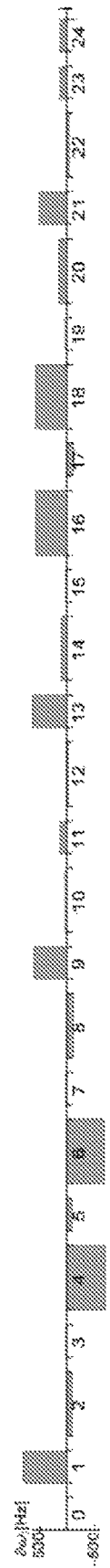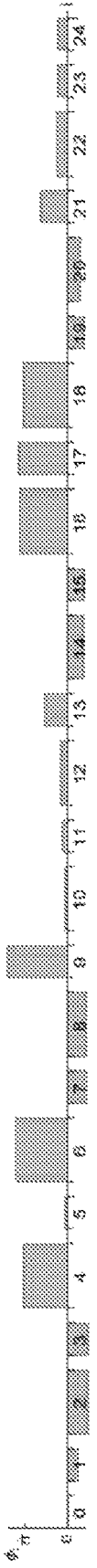
Fig. 4a Fig. 4b Fig. 4c Fig. 4d Fig. 4e Fig. 4f

DETERMINING A SPATIAL CONFIGURATION OF MULTIPLE NUCLEI

CROSS-REFERENCE TO RELATED APPLICATIONS

The present application claims priority from Australian Provisional Patent Application No 2015902551 filed on 30 Jun. 2015, the content of which is incorporated herein by reference.

TECHNICAL FIELD

This disclosure relates to determining a spatial configuration of multiple nuclei. In particular, but not limited to, this disclosure relates to systems and methods for determining a spatial configuration of multiple nuclei. The systems include computer systems and the methods include computer implemented methods.

BACKGROUND

The ability to directly image the atomic structure of a single bio-molecule remains one of the great challenges in the physical biosciences. The vast effort put into existing and developing techniques to determine bio-molecule structure is testament to the importance of this problem, however, techniques based on conventional x-ray crystallography, nuclear magnetic resonance (NMR), and free electron laser femtosecond crystallography all rely on averaging over large ensembles of molecules. The single-molecule realm remains unsolved.

Any discussion of documents, acts, materials, devices, articles or the like which has been included in the present specification is not to be taken as an admission that any or all of these matters form part of the prior art base or were common general knowledge in the field relevant to the present disclosure as it existed before the priority date of each claim of this application.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

SUMMARY

A system for determining a spatial configuration of multiple nuclei comprises:

an electron dipole to generate a spatially varying magnetic field such that each of the multiple nuclei is resonant at a respective resonance frequency defined by the magnetic field at a location of that nucleus;

a first signal generator to generate a first signal at a first signal frequency such that, as a result of dipole-dipole interaction between the electron dipole and a subset of the multiple nuclei that are resonant at the first signal frequency, a phase of the electron dipole is indicative of a number of nuclei that are resonant at the first signal frequency; and a readout module
to determine the phase of the electron dipole, and
to determine the spatial configuration of the multiple nuclei based on the phase of the electron dipole.

Since the dipole is used as a sensor as well as a generator of the spatially varying magnetic field, that is, a field gradient, the overall dimensions of the set-up are in the range of a few nanometres. As a result, the magnetic field gradient is extremely steep and the spatial resolution of the sensing is extremely large and matches the size of individual atoms. As a result, the nuclear structure of molecules can be determined with low noise, which is an advantage over existing methods that do not provide the spatial resolution to image individual molecules.

The spatially varying field may be a quantum magnetic field and may comprise a superposition of two or more magnetic states.

The electron dipole may comprise a single electron, such as Phosphorus in Silicon or may comprise multiple electrons, such as a Nitrogen Vacancy in a diamond.

The electron dipole may have an associated nuclear spin.

The electron dipole may be one of:
a nitrogen vacancy qubit; and
a SiP qubit.

The system may further comprise a second signal generator to generate a second signal that decouples the multiple nuclei from each other to reduce interaction between the nuclei.

The first signal generator and the second signal generator may be the same signal generator.

The second signal may be spectrally broad to decouple all of the multiple nuclei from each other while the first signal may be spectrally narrow to bring only the subset of the multiple nuclei into resonance.

The first signal may comprise multiple first pulses and the second signal may comprises multiple second pulses and the multiple first pulses and multiple second pulses may be interleaved.

Interleaving the first signal pulses with the second signal pulses allows simultaneous actions of the first signal to facilitate interaction between the electron dipole and a subset of the multiple nuclei and the second signal to decouple the multiple nuclei from each other to reduce interaction between the nuclei.

The system may further comprise a field generator to generate a magnetic control field to spatially adjust the spatially varying magnetic field generated by the electron dipole.

The system may further comprises one or more further electron dipoles to generate the spatially varying magnetic field such that each of the multiple nuclei is resonant at a respective resonance frequency defined by the magnetic field at a location of that nucleus.

The electron dipoles may be entangled.

A method for determining a spatial configuration of multiple nuclei comprises:

arranging an electron dipole in close proximity to the multiple nuclei such that the electron dipole generates a spatially varying magnetic field and each of the multiple nuclei is resonant at a respective resonance frequency defined by the magnetic field at a location of that nucleus;

generating a first signal at a first signal frequency such that, as a result of dipole-dipole interaction between the electron dipole and a subset of the multiple nuclei that are resonant at the first signal frequency, a phase of the electron dipole is indicative of a number of nuclei that are resonant at the first signal frequency;

determining the phase of the electron dipole; and
determining the spatial configuration of the multiple nuclei based on the phase of the electron dipole.

Generating the first signal may comprise generating the first signal to rotate the multiple nuclei in relation to the electron dipole.

The method may further comprise generating a second signal to decouple the multiple nuclei from each other to reduce interaction between the nuclei.

The method may further comprise controlling a wave function of the electron dipole to modify the dipole-dipole interaction between the electron dipole and the subset of the multiple nuclei.

The method may further comprise generating a magnetic control field to spatially adjust the spatially varying magnetic field generated by the electron dipole.

The method may further comprise performing the steps of generating the first signal and determining the phase of the electron dipole multiple times for respective multiple spatial adjustments of the magnetic field generated by the electron dipole to determine multiple phases such that each of the multiple phases is associated with one of the multiple spatial adjustments. Determining the spatial configuration may comprise determining the spatial configuration based on the multiple phases and the multiple spatial adjustments.

The method may further comprise performing the steps of generating the first signal multiple times at respective multiple first signal frequencies and determining the phase of the electron dipole for each of the multiple first signal frequencies such that each of the multiple phases is associated with one of the multiple first signal frequencies. Determining the spatial configuration may comprise determining the spatial configuration based on the multiple phases and the multiple first signal frequencies.

The method may further comprise performing the steps of generating the first signal and determining the phase of the electron dipole multiple times for respective multiple pairs of first signal frequency and spatial adjustment of the magnetic field generated by the electron dipole to determine multiple phases such that each of the multiple phases indicative of a number of nuclei that are resonant at the first signal frequency is associated with one of the multiple pairs of first signal frequency and spatial adjustment. Determining the spatial configuration may comprise determining the spatial configuration based on the multiple phases and the multiple pairs of first signal frequency and spatial adjustment.

Determining the spatial configuration may comprise mapping the number of nuclei associated with each of the multiple pairs of first signal frequency and spatial adjustment to an output coordinate system.

Mapping the number of nuclei associated with each of the multiple pairs of first signal frequency and spatial adjustment to the output coordinate system may comprise linearizing the multiple phases with respect to the first signal frequency to determine a linearized phase; and determining the spatial configuration based on the linearized phase.

Determining the spatial configuration may comprise determining the number of nuclei at each point of an output space by accounting for multiple contributions of the same nucleus to each point of the output space.

Determining the spatial configuration may comprise performing a de-convolution of the linearized phase to determine a spin density for each of multiple voxels as the spatial configuration of the multiple nuclei.

The method of claim may further comprise generating a graphical display of the multiple voxels to indicate the spin density for each of the multiple voxels.

A computer system for determining a spatial configuration of multiple nuclei comprises:

an input port to receive phase measurements of an electron dipole;

an output port to send a command to a first signal generator; and a processor to determine a first signal frequency and a first signal at the first signal frequency such that, as a result of dipole-dipole interaction between the electron dipole and a subset of the multiple nuclei that are resonant at the first signal frequency, a phase of the electron dipole is indicative of a number of nuclei that are resonant at the first signal frequency, to send over the output port a command to the first signal generator to generate the first signal at the first signal frequency, to receive a phase measurement of the electron dipole through the input port, and to determine the spatial configuration of the multiple nuclei based on the phase measurement.

A computer implemented method for determining a spatial configuration of multiple nuclei comprises:

receiving multiple data values related to a phase of an electron dipole, each data value being associated with one of multiple spatial configurations of a magnetic field generated by the electron dipole and with one of multiple first signal frequencies and each data value being indicative of a number of nuclei that are resonant at the associated first signal frequency;

determining the spatial configuration of the multiple nuclei based on the multiple data values, the multiple spatial configurations and the multiple first signal frequencies.

Software that, when installed on a computer, causes the computer to perform the above method.

Optional features described of any aspect of method, computer readable medium, software or computer system, where appropriate, similarly apply to the other aspects also described here.

BRIEF DESCRIPTION OF DRAWINGS

An example will be described with reference to

FIG. 4a illustrates a selective control rotation pulse of length τ. It selectively rotates the population state of the nuclear spins located on a particular coupling surface with resonant frequency $\omega_i$.

FIG. 4b illustrates a non-selective, spectrally broad, 90° pulses used for the nuclear decoupling sequence.

FIG. 4c illustrates a CORY24 nuclear decoupling sequence. It has no effect on the probe spin, as the pulse frequency is away from the electronic resonant condition, the nuclear spins are coupled to the probe spin, but decoupled from each other.

FIG. 4d illustrates how the control rotation pulses R are embedded into the decoupling sequence in place of the free precession time τ, their phase and frequency is tailored to produce a cumulative resonant nuclear spin state rotation in the selected interaction surface.

FIG. 4e illustrates the frequency detuning for the control of the polar tilt of $R^i$ rotation axis (initial 24 pulses for an nuclear spin on k=8 kHz interaction surface).

FIG. 4f illustrates the phase of the driving field used for $R^i$ pulse synchronisation.

DESCRIPTION OF EMBODIMENTS

This disclosure relates to employing a quantum spin probe as a 3D nanoscale magnetic resonance imaging (MRI) system. The probe acts simultaneously as the MRI sensor and the natural field gradient of the probe field is used to spatially encode nuclear spin frequencies over 'dipole slices', controlled by a background magnetic field.

A quantum control protocol interleaves three aspects simultaneously: decoupling of specific nuclear spin species in the molecule via magic-angle spinning in Hilbert space, resonant driving of nuclear spins in specific dipole slices, and detection by the probe spin. A processor receives this data set, containing spatial information of the nuclear spin density over many orientations and radial positions of the dipole slice and then deconvolves the data set to produce high-resolution spatial 3D images of the targeted nuclear spin densities, allowing the molecular structure as a whole to be determined, which may be referred to more broadly as determining a spatial configuration of multiple nuclei.

Using the ~1 kDa Rapamycin molecule ($C_{51}H_{79}NO_{13}$) as an example we simulate the protocol directly and show that for realistic probe coherence and stand-off parameters the hydrogen and carbon sub-structure can be imaged with ~1 Å average resolution and structure error of 0.5 Å. With excellent prospects for implementation using quantum spin probes in diamond (NV) or silicon (Si:P), and potential scaling to large molecules of interest including membrane proteins, the quantum-probe based nano-MRI protocol provides a unique and realistic pathway for single-molecule structure determination.

This disclosure presents a method to use a quantum spin probe as a 3D nanoscale magnetic resonance imaging (MRI) system. This disclosure shows how a single spin quantum probe can be used to perform magnetic resonance imaging (MRI) at the nanoscale. Proposed is a methodology for 3D Angstrom resolution magnetic resonance imaging (MRI) of a single molecule, utilising a single-spin probe which acts as both the sensor and as an effective sub-nano MRI gradient field.

Figure 1A:
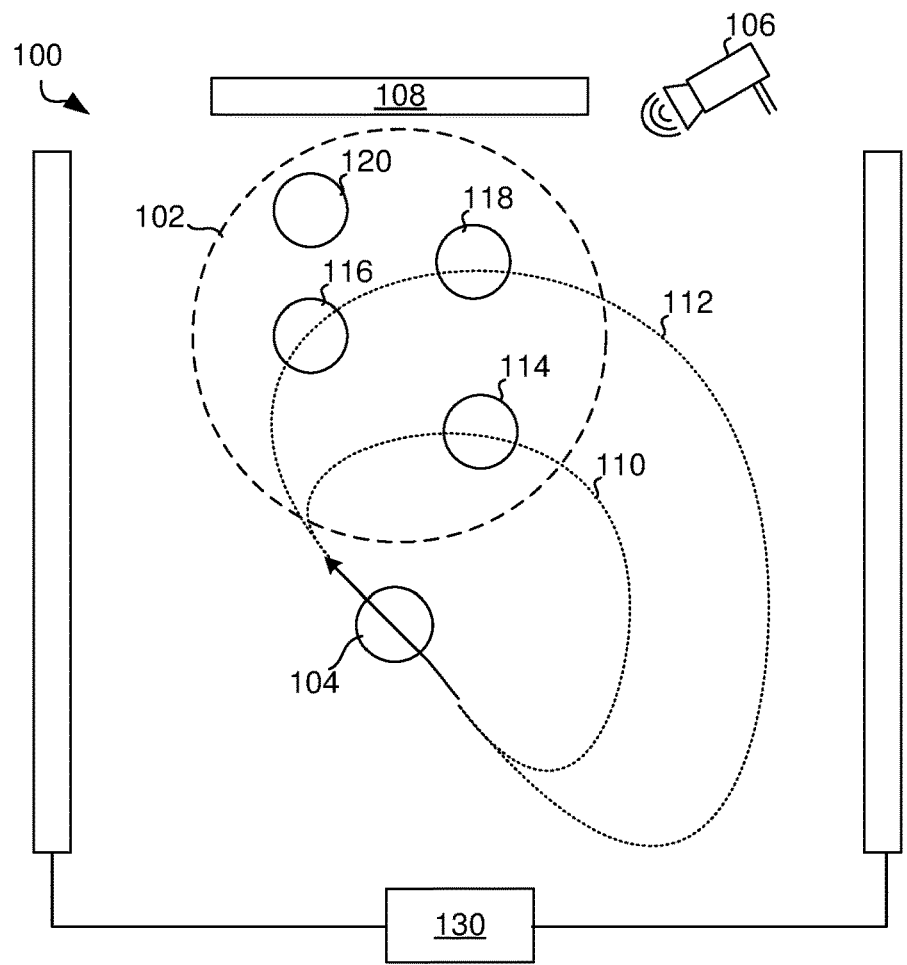
FIG. 1a illustrates a system for determining a spatial configuration of multiple nuclei.

FIG. 1a illustrates a system 100 for 3D molecular imaging, that is, determining a spatial configuration of multiple nuclei 102. System 100 comprises an electron dipole 104, a first signal generator 106 and a readout module 108.

Figure 1B:
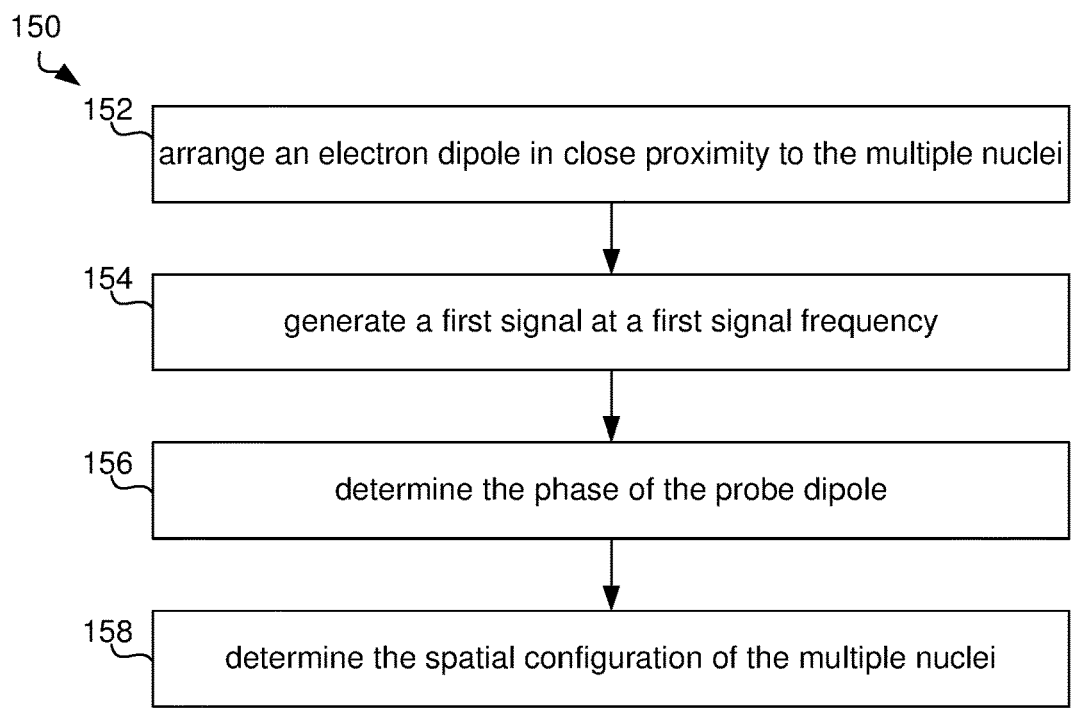
FIG. 1b illustrates a method for determining a spatial configuration of multiple nuclei.

FIG. 1b illustrates a method 150 for determining a spatial configuration of multiple nuclei. The system of FIG. 1a and the method of FIG. 1b will now be described concurrently.

The first step of method 150 is to arrange 152 the electron dipole 104 in close proximity to the multiple nuclei. The electron dipole 104 generates a spatially varying magnetic field as illustrated by two lines 110 and 112 of constant magnetic field. It is noted that in a real-world three-dimensional setting interaction surfaces represent constant magnetic field, that is, the two lines 110 and 112 are cross-sections of the three-dimensional interaction surfaces.

All points on first line 110 experience the same first magnetic field. All points on second line 112 experience the same second magnetic field. The first magnetic field experienced by points on the first line 110 is stronger than the second magnetic field experienced by points on the second line 112 as the first line 110 closer to dipole 104 than the second line 112. For example, a first nucleus 114 lies on the first line 110 and therefore experiences a relatively high magnetic field from the dipole 104. In contrast, second nucleus 116 and third nucleus 118 both lie on the second line 112 and therefore experience a relatively low magnetic field.

According to the basic principle of MRI, the magnetic field experienced by the nuclei 114, 116 and 118 defines the frequency at which those nuclei are resonant. As a result, the first nucleus 114 is resonant at a relatively high frequency, while second nucleus 116 and third nucleus 118 are resonant at a relatively low frequency. In other words, each of the multiple nuclei is resonant at a respective resonance frequency defined by the magnetic field at a location of that nucleus.

The first signal generator 106 generates 154 a first signal at a first signal frequency such that a subset of the nuclei 102 is resonant. For example, the first signal generator 106 generates a signal at a relatively high frequency corresponding to the magnetic field along the first line 110. As a result, only nucleus 114 is in the subset of resonant nuclei. Alternatively, signal generator may generate a signal at a relatively low frequency corresponding to the magnetic field along the second line 112. As a result, nuclei 116 and 118 are in the subset of resonant nuclei.

Following the example of resonant nuclei 116 and 118, the signal generated by signal generator 106 is pulsed in order to rotate the spins of the resonant nuclei 116 and 118 based on the state of the dipole 104 such that as a result of dipole-dipole interaction between the electron dipole 104 and the nuclei 116 and 118, the phase of the electron dipole 104 is indicative of a number of nuclei that are resonant at the relatively low signal frequency.

Figure 2C:
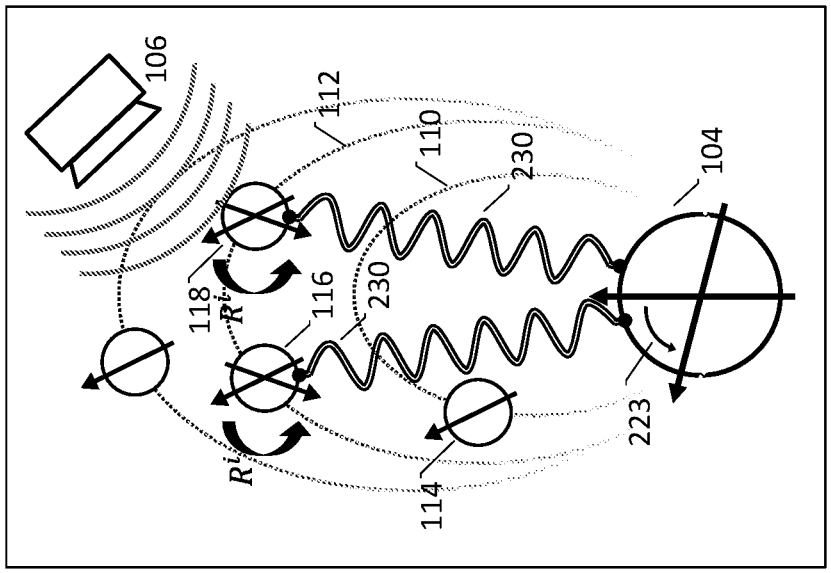
FIGS. 2a to 2c provide an intuitive illustration of the quantum mechanical process of phase accumulation.
Figure 2B:
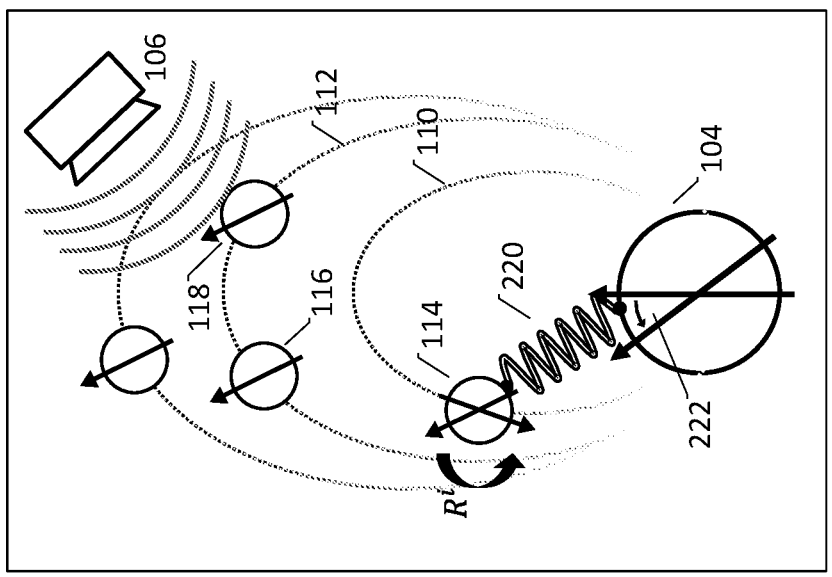
Figure 2A:
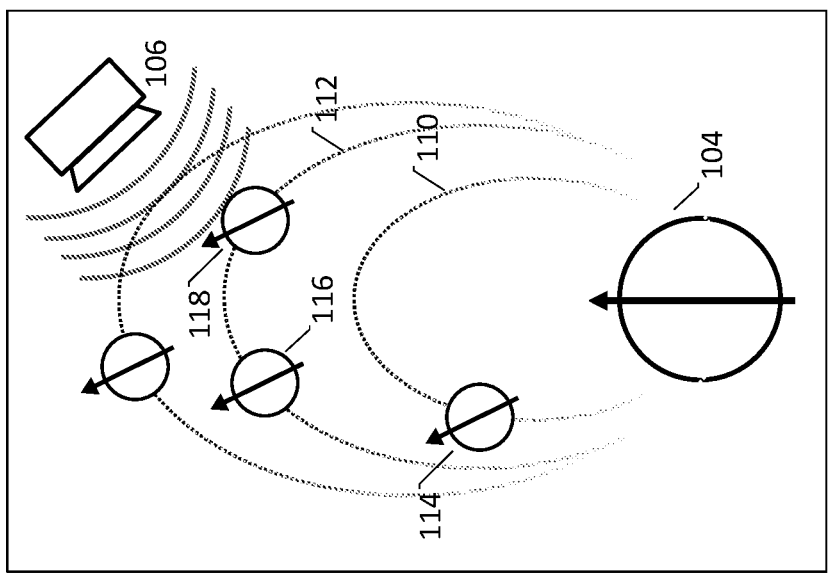

FIGS. 2a to 2c provide a simplified illustration to explain the quantum mechanical process intuitively.

FIG. 2a illustrates the case where first signal produced by generator 106 is not resonant with any of the lines, as a result the phase of the 104 spin remains unchanged.

FIG. 2b illustrates the example where the first signal is resonant with line 110, containing only one nucleus 114. First signal induces a rotation $R^i$ of the nuclear spin 114. As a result of dipole-dipole interaction 220 between the probe 104 and the single nucleus 114, the probe 104 experiences a phase change by a relatively small phase change angle 222.

FIG. 2c illustrates the example where the first signal is resonant with line 112 containing two nuclei 116 and 118. As a result of dipole-dipole interaction 230 between the probe 104 and the nuclei 116 and 118, the probe 104 experiences a phase change by a relatively large phase change angle 232.

As can be observed by comparing the phase change angle 222 FIG. 2b to phase change angle 232 in FIG. 2c, the phase change angle 222 is smaller than the phase change angle 232 due to the smaller number of resonant nuclei. Therefore, the phase change angle is indicative of the number of nuclei that are resonant at the current signal frequency and by measuring the phase change angle, the number of nuclei on the line corresponding to the current signal frequency can be determined.

Readout module 108 performs this step and determines 156 the phase of the electron dipole 104 and determines 158 the spatial configuration of the multiple nuclei based on the phase of the electron dipole 104. For example, the readout module determines a relatively large phase when a relatively low frequency signal is applied by signal generator 106 and therefore determines that two nuclei are relatively far away from probe 104. While this can be considered a spatial configuration, further details of determining the spatial configuration more specifically will be described further below with reference to FIG. 5.

The nuclei 114, 116, 118 and 120 may interact between each other, which inhibits the detection of a phase change on probe 104 as a result of dipole-dipole interaction. Therefore, the same signal generator 106, or a different second signal generator, may generate a second signal that decouples the nuclei 114, 116, 118 and 120 from each other to reduce interaction between the nuclei. This second signal may be spectrally broad to decouple all of the multiple nuclei 114, 116, 118 and 120 from each other while the first signal may be spectrally narrow to bring only the subset of the multiple nuclei into resonance, such as only nuclei 116 and 118.

While FIG. 1 illustrates the system in a 2-dimensional view for simplicity of illustration, it is noted that the system may resolve the spatial configuration of the nuclei 114, 116, 118 and 120 in three dimensions. This can be achieved by rotating the lines 110 and 112 around dipole 104 to select different subsets of nuclei. A field generator 130 controls a constant magnetic field, which controls this rotation of lines around dipole 104. This way, the field generator 130 spatially adjusts the spatially varying magnetic field generated by the electron dipole 104.

In another example, a further electric field is applied to control the wave function of the electron dipole, which changes the shape/location of the interaction surfaces, that is, the electric field further spatially adjusts the spatially varying magnetic field. This modifies the dipole-dipole interaction between the electron dipole and the subset of the multiple nuclei.

FIGS. 3a-3e outline the overall method consisting of the set up, control protocol, measurement and data analysis, spin density imaging and molecular reconstruction. At this stage the concept is explained generally while noting that it is applicable to a wide range of different probes, such as the nitrogen-vacancy centre in diamond (NV) and the phosphorus donor in silicon (Si:P).

Figure 3A:
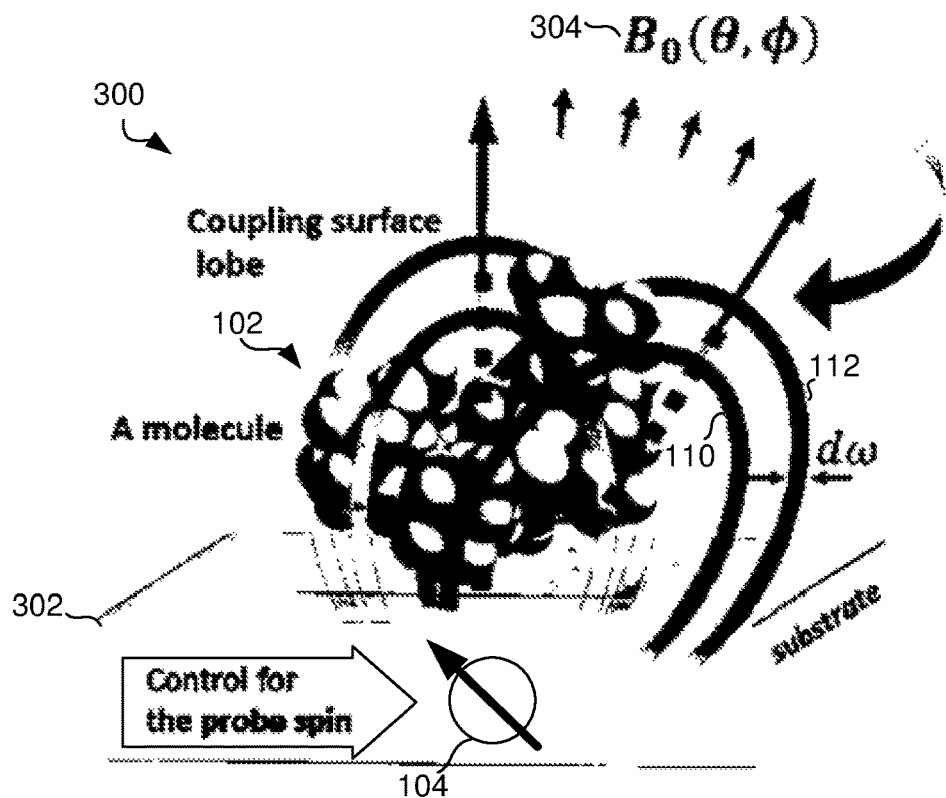
FIG. 3a illustrates a set-up consisting of a controllable electronic probe situated 3-4 nm below the surface of the substrate, above which a molecule is located (either by scanning means or directly on the substrate). The probe acts as both sensor and gradient field source for the spatial-frequency encoding of the nuclear spins in the target molecule. To reconstruct the molecular nuclear spin density, the interaction dipole lobe surface is spatially rotated by varying the background magnetic field angle $B_0(\theta,\phi)$.

FIG. 3a illustrates a set-up 300 consisting of a single controllable electron-spin probe 104, located 3-4 nm nanometres below the substrate surface 302, above which the target molecule comprising multiple nuclei 102 is located. Positioning the molecule of interest above the spin probe 104 can be achieved in several ways, including selective chemical bonding to the surface and/or matrix, or by utilising a STM tip.

In one example, the probe is in a substrate near the surface and the target molecule is on the surface immediately above the probe is immobile, but the background field controls the orientation of the dipole "lobe".

In another example, the probe is on a scanning tip and moved in small increments this could be useful where controlling the dipole "lobe" by the background field is not as easy, or more control of the probe-target distance is desired. The target molecule may also be on the scanning tip directly.

While the examples herein relate to a single electron spin probe, it is noted that multiple spin probes may be used. The multiple spin probes may be offset from each other and may be entangled to achieve an improved spatial resolution and sensitivity. The magnetic field from probe 104 may be quantum in nature because it could be in a superposition of two magnetic states.

In order to achieve high resolution the vibrational and rotational degrees of freedom in the molecule may be suppressed in some fashion, e.g. by keeping the system at low temperature.

The spatial localisation of the probe spin allows it to be in close proximity to the molecule and the dipole interaction field between the molecular nuclear spins and the electronic probe spin takes the role equivalent to the classical gradient field in conventional MRI (FIG. 3a). The direction of a background magnetic field $B(\theta,\phi)$ 304 as generated by generator 130 defines the quantisation axis of both the probe spin and the nuclear spins of the molecule, thus providing a way of controlling the dipole-dipole interaction field orientation.

The nuclear spins in the molecule are subjected to two different regimes of control—a high amplitude constant radio frequency field used for nuclear decoupling, and a considerable weaker field of a variable frequency used for resonant extraction of spatial information as generated by signal generator 106. In one example, system 300 primarily focuses on imaging the hydrogen nuclear density as the most abundant in organic molecules, however, the method is also applicable to carbon or nitrogen spin densities through isotope enrichment.

As a MRI based method, the proposed protocol encodes structural spatial information onto frequency space. However, in contrast to conventional MRI, where magnetic field gradient forms equipotential planar slices, the nuclei experiencing equal interaction to the probe spin are located on curved, non-uniform surfaces 110 and 112, characteristic of dipole-dipole lobes as qualitatively illustrated in FIGS. 1 and 3*a*.

The exact shape of the interaction surfaces depends on the probe wave function. In one example, it is assumed that the wave function is highly localised. Details of the actual probe electronic wave function would modify the coupling profile, however the overall imaging methodology itself is independent of any particular shape of the interaction surfaces. Through quantum control of both probe and target spins information about the nuclear spin density on each of the interaction surfaces is extracted.

Figure 3B:
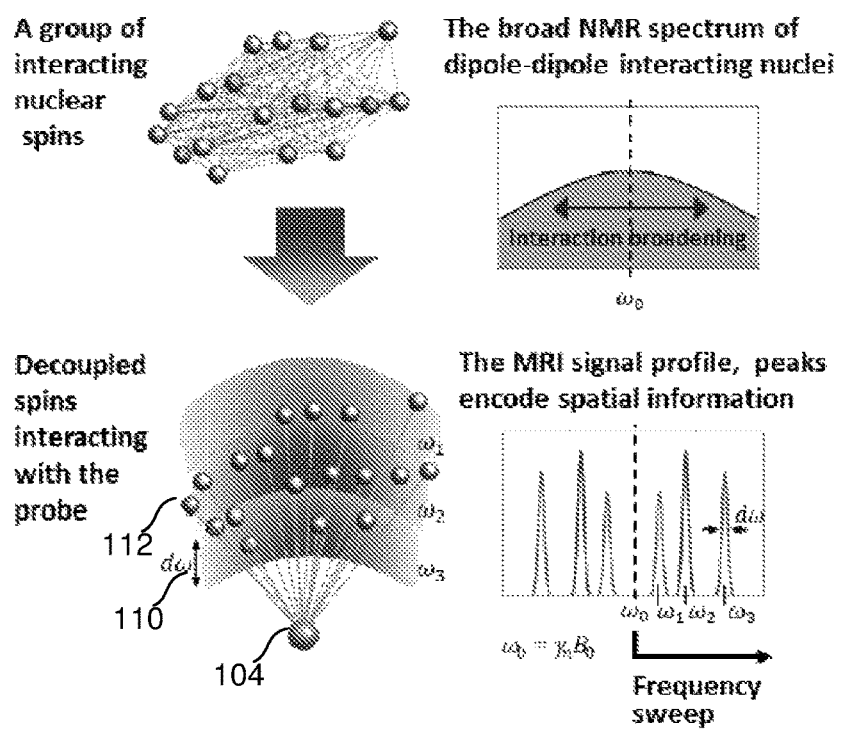
FIG. 3b illustrates how initially, the NMR spectrum of the molecule is broadened by the numerous nuclear dipole-dipole interactions (thin lines). Decoupling nuclei from each other while simultaneously introducing the coupling gradient field of the probe provides a MRI signal spectrum, where a peak's amplitude characterises the spin density on the corresponding probe coupling surface.

A NMR spectrum of a stationary molecule is dominated by its intrinsic dipole-dipole iterations (FIG. 3*b*, top), causing each nucleus to be detuned from the resonant frequencies defined by the probe interaction surfaces. The average extent of such detuning for $H^1$ nuclear spins is comparable to their coupling to the probe spin, leading to a loss of correlation in mapping form real onto frequency space. To overcome this obstacle, a control protocol may simultaneously suppresses the coupling between the nuclei themselves, and extract the information about the number of nuclei present on each of the interacting surfaces (FIG. 3*b*, lower).

Figure 3C:
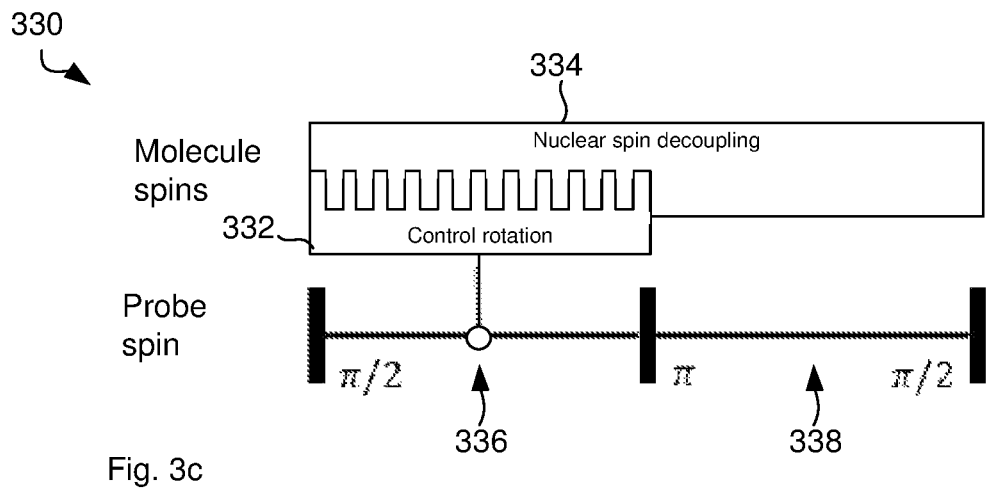
FIG. 3c illustrates a high-level schematic overview of the proposed control protocol structure consisting of a spin-echo sequence on the probe spin, and the controlled nuclear spin rotation based of the probe state imbedded into a nuclear decoupling sequence.
Figure 3D:
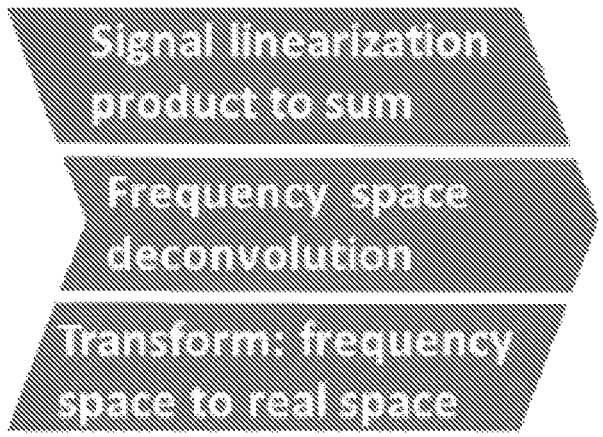
FIG. 3d schematically illustrates signal processing to structure reconstruction which occurs in three stages: data linearisation, frequency space deconvolution, and transformation to real-space nuclear density.
Figure 3E:
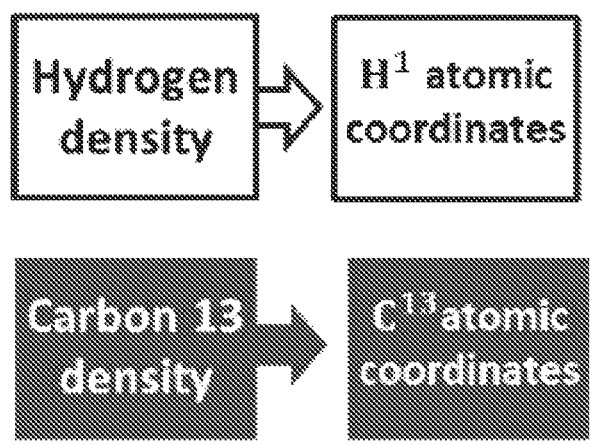
FIG. 3e illustrates nuclear spin densities that are obtained through optimised inversion of the transformation, leading to the atomic resolution coordinate reconstruction of the position of hydrogen atoms, and other non-zero nuclear spin species such as carbon-13.

FIG. 3*c* illustrates an example protocol 330 that is composed of a spin echo sequence 332 of length t performed on the probe and a decoupling sequence 334 applied on the nuclear spins. In the first time period (0→t/2) 336, a controlled rotation of the nuclear spins located on a chosen resonant interaction surface is performed based on the probe spin state. This defining feature induces a phase in the probe spin state that contains the information about the nuclear number density present on the probed interaction surface. In the second time period (t/2→t) 338 the nuclear spins are subjected to decoupling sequence only, inducing no additional phase in the probe spin state.

This particular case, where only one half of the probe's spin-echo sequence receives the information, is chosen in particular for its high quality signal output of a simple sinusoidal form. In comparison, application of control rotations to both halves of the spin-echo sequence introduces modulations in the probe's signal of frequency equal to half of nuclear-probe interaction strength, leading to a loss of contrast in realistic conditions due to the spectral width of a interaction surface. In principle, higher order CPMG-type sequences can be used on the probe, containing multiple appropriately implemented control rotation segments. However, a balance needs to be achieved as the rate of information transfer from molecular nuclear spins to the probe is set by the coupling strength between the two, high order sequences can have a negative effect on sensitivity as they serve to decouple the probe from the nuclear spins.

Suppression of coupling between nuclear spins can be performed in solid state NMR, by physical or Hilbert space rotations. Physical rotations around the dipole magic-angle may be useful in practice. However, nanometre scale rotations of a single molecule relative to a single spin probe are outside the reach of immediate mechanical applications, thus we examine Hilbert-space techniques to achieve the same result. Out of multiple families of Hilbert-space approaches, the two most dominate branches in the group of on-resonance pulses are the Solid-echo and Magic-echo based sequences as described in: Klinowski, J, "New Techniques in Solid-State NMR", Springer 2005, ISBN 978-3-540-22168-5, which is incorporated herein by reference. The former utilise multi axis 90° pulses to perform effective spin precession abound the magic-angle axis, and the latter are based on 360° pulses.

In one example, generator 106 generates solid-echo type sequences and integrates them with control rotations on the nuclear spins. These decoupling sentences are made up of unit blocks of the following form: $90_x$–τ–$90_y$–2τ–$90_{-y}$–τ–$90_{-x}$, where $90_{\pm x/y}$ are 90° square pulses around positive/negative x or y axis, and τ is the free evolution time of length shorter than nuclear dipole-dipole coupling rates in a molecule.

A dipole-dipole NMR spectrum of a molecule in a uniform magnetic field $B_0$ has a symmetric spectrum centred around the frequency set by the background field $\gamma_n B_0$, where $\gamma_n$ is the nuclear gyromagnetic ratio. The square decoupling pulses are also centred around the same frequency, but have a spectral spread wider than the molecular NMR spectrum. This ensures appropriate narrowing of the spectrum towards the background frequency $\gamma_n B_0$.

In contrast to classical gradient fields, generator 106 may maintain this symmetry of the NMR spectrum by keeping the probe spin in an equal superposition throughout application of the decoupling pulses, while keeping the free precession time equal to the full number of background field periods $\tau = n_d 2\pi/\gamma_n B_0$, $n_d \in \mathbb{N}$. The probe itself does not participate in the effective magic angle spinning as its electronic spin has different resonant frequency. In turn the probe coupling terms to each nuclei, $k(r_{q,\phi})$, remain unaffected and define the interaction surfaces characterised by $r_{q,\phi}$, the distance from the probe to a nucleus relative to a quantisation axis of polar direction (θ,φ). This feature allows the spin-echo sequence on the probe to refocus the phase offsets encountered by nuclear spins on different interaction surfaces, thus maintaining their coherence under a gradient coupling regime.

FIG. 4*a* schematically illustrates fine driving pulses $R(\omega, \varphi, \tau, B_w)_{\hat{n}}$. A controlled rotation of the nuclear spins based on the probe spin may be achieved by an application of the fine driving pulses $R(\omega, \varphi, \tau, B_w)_{\hat{n}}$, during the free precession time τ, where $B_w$ is the driving field amplitude of starting phase ω and frequency ω, defining a net rotation around axis n̂.

FIG. 4*b* illustrates strong pulses that belong to the solid-echo (decoupling) sequence and suppress the coupling between the nuclei, while the weaker R pulses are set resonant to a particular interaction surface $\omega = \gamma_n B_0 + k/2$. Each R pulse induces a perturbation in the states of a selected nuclear population of magnitude $\tau \gamma_n B_w$. The consecutive R pulses are all synchronised in order to produce a cumulative effect. This is achieved by setting the parameters ω and ω in accordance with both the previous R and 90° decoupling pulses. The overall nuclear dynamics is characterised by the slow modulation envelope due to R pulses on top of the fast dynamics of the decoupling sequence. Under a relatively long spin-echo sequence ($t \sim 1/\gamma_n B_w^2 \tau$), the probe is only sensitive to the slow dynamics associated with the nuclear spins located on the selected interaction surface.

Detailed Outline of the Proposed Control Protocol.

One example of the control protocol utilises the CORY24 decoupling sequence as illustrated in FIG. 4c and as described in D. G Cory, Journal of Magnetic Resonance, Volume 94, Issue 3, 1 Oct. 1991, Pages 526-534, which is incorporated herein by reference. The integration of R pulses into the decoupling sequence is shown in FIG. 4d. The R pulses are interleaved with the decoupling sequence which means that the R pulses occur during times of no decoupling. While some examples show a sequential configuration, other non-sequential timing may also be possible.

The decoupling pulses are timed from the background magnetic field frequency $\gamma_n B_0$, yet the nuclear spins process with different frequencies $\omega=\gamma_n B_0+k/2$, therefore as observed in the frame of an interaction surface (defined by k), the direction of the decoupling pulses rotates with relative frequency $k/2$.

Figure 4G:
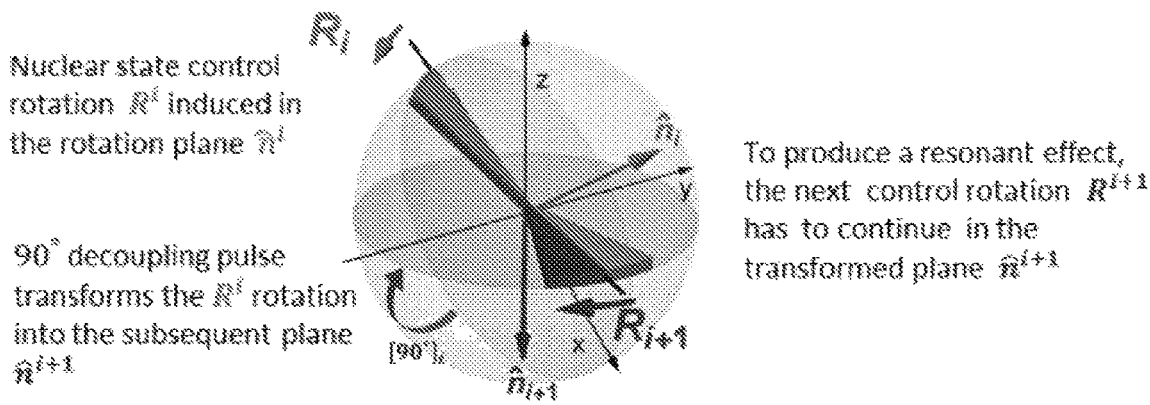
FIG. 4g illustrates how the phase and frequency for $R^i$ pulses are synchronised through tracking the plane of rotation (direction of the driving field) as it is transformed by 90°.

The plane defined by a normal $\hat{n}_i$, in which $R_i$ induces a rotation, transforms into $\hat{n}_{i+1}$ plane under an influence of a decoupling $[90°]_i$ pulse. To achieve the resonant effect the following pulse $R_{i+1}$ performs a control rotation in the transformed plane $\hat{n}_{i+1}$ so that it can cumulatively add to the previous rotation of the nuclear spin state as shown in FIG. 4g.

The initial pulse $R^0$ constitutes a controlled rotation in the direction $\hat{n}_0$, which can be an equatorial direction of choice (e.g. x-axis). At the end of the CORY24 sequence the net cumulative control rotation of the selected nuclear spins is returned back to this direction, leading to a change in the z-projection of the nuclear spin states which is detected by the probe.

Relative to the initial axis $\hat{n}_0$, any subsequent control rotation $R^i$ is formulated by transformation of $\hat{n}_0$ under the decoupling 90° pulses as observed in the frame of the particular interaction surface characterised by coupling strength k:

$$\hat{n}_i = \prod_{j=1}^{i} e^{+ikt_j}[90°]_j e^{-ikt_j}\hat{n}_0. \tag{1}$$

where $[90°]_j$ is the $j^{th}$ decoupling pulse occurring at time $t_j$.

Figure 4H:
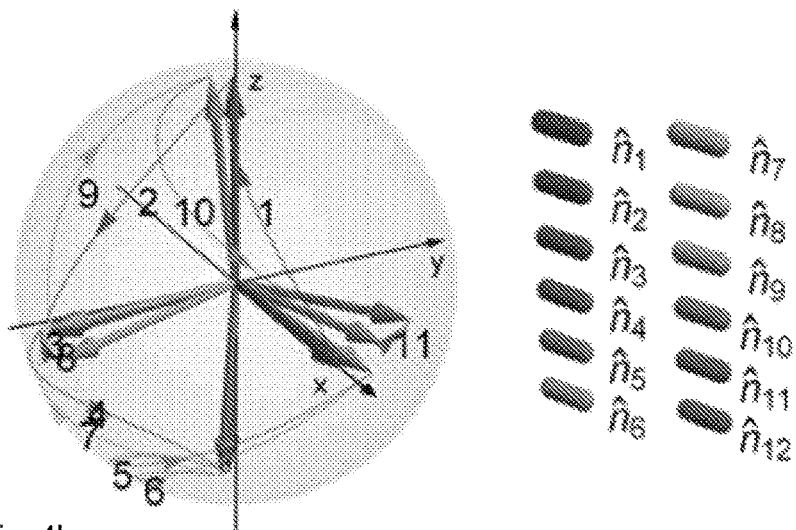
FIG. 4h illustrates an example of several consecutive planes of rotation defined by their normals $\hat{n}_i$. Note: each interaction surface has a unique pattern of driving field parameters, as the decoupling pulses are timed according to the background magnetic field from which the interaction surfaces are shifted away by the coupling to the probe spin.

Once the unique sequence of driving directions is calculated for a desired interaction surface (FIG. 4h), it follows that a pulse $R^i$ resonant with the interaction surface of coupling strength k, is constructed by applying the magnetic field of frequency $\omega_i$ and initial phase $\varphi_i$ as defined by $\hat{n}_i=(\hat{n}_{ix},\hat{n}_{iy},\hat{n}_{iz})$:

$$\omega_i = (\gamma_n B_0 + k/2) + \delta\omega_i; \tag{2}$$

$$\delta\omega_i = \frac{B_w \hat{n}_{iz}}{\sqrt{\hat{n}_{ix}^2 + \hat{n}_{iy}^2}}, \tag{3}$$

$$\varphi_i = \arctan(\hat{n}_{iy}/\hat{n}_{ix}) + (\gamma_n B_0 + k)t_i. \tag{4}$$

The frequency shift $\delta\omega_i$ defines the polar tilt of the rotation axis while phase $\varphi_i$ defines the azimuthal direction. The frequency and phase control are depicted in FIGS. 4e and 4f. From the perspective of practical implementation the phase of the driving field of each pulse $R^i$ is more relevant than the frequency shift $\delta\omega_i$. In case of high background magnetic fields (~1T) and relatively low driving fields (~1 µT) the frequency shifts are relatively low.

Figure 4I:
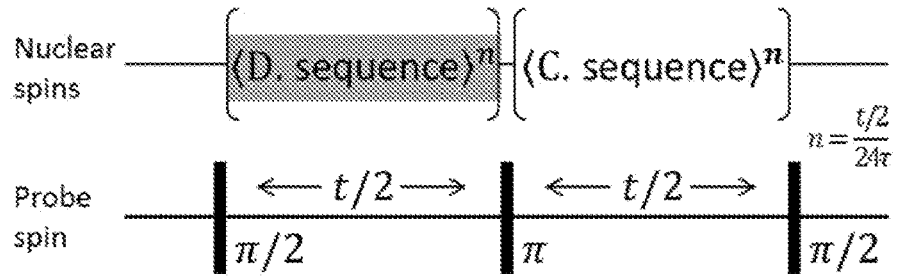
FIG. 4i illustrates the total control protocol. The phase induced in the evolution of the probe spin by the selective control rotation of the nuclear spins is a function of the quantity of nuclear spins on the probed interaction surface. The π pulse on the probe serves to refocus both the probe phase, and the effects of probe's gradient coupling on the nuclear spins.

Furthermore, the average $\delta\omega_i$ is equal to zero, thus keeping the driving frequency constant (unlike the phase) $\omega_i=(\gamma_n B_0+k/2)$ across all R pulses produces the resonant behaviour comparable, to within several percent, to the full variable frequency control. The fully integrated control protocol is depicted in FIG. 4i—this sequence will be used to (theoretically) demonstrate the imaging method on one molecule of rapamycine (~1 kDa).

When the power broadening due to fine driving field $B_w$ is smaller than the probe coupling $k(r_{\theta,\phi})$, and the probe spin is held in an equal superposition state, the signal $S_i$ generated by one nuclear spin under the sequence (FIG. 4e) is well approximated by the following form:

$$S_i(\omega, \theta, \phi, t, B_w) = \frac{1}{2}\cos\left(\frac{1}{8}\gamma_n B_w t \frac{\gamma_n B_w}{\sqrt{(\gamma_n B_w)^2 + 2(\Delta_+^2 + \Delta_-^2)}}\right)e^{-t/T_{2n}}, \tag{5}$$

$$\Delta_\pm = \gamma_n B_0 + \gamma_n B_w \pm \frac{k(r_{\theta,\phi}^i)}{2} - \omega, \tag{6}$$

where $r_{\theta,\phi}^i$ is the coordinate of the of the $i^{th}$ nuclear spin relative to the quantization axis in the detection $(\theta,\phi)$; $\omega$ is the fine driving frequency of the R control rotation pulse applied with field strength $B_w$, t is the total time of the protocol, $B_0$ is the background magnetic field and $T_{2n}$ is the effective transverse coherence time of nuclear spins.

The interaction surface is defined by the coupling parameter $k(r_{\theta,\phi}^i)$, and the extraction of the spatial information is detailed later. The quantity $\Delta_\pm$ is associated with the fine driving frequency detuning from either of the two coupling frequencies provided by the probe's equal superposition state.

Figure 4J:
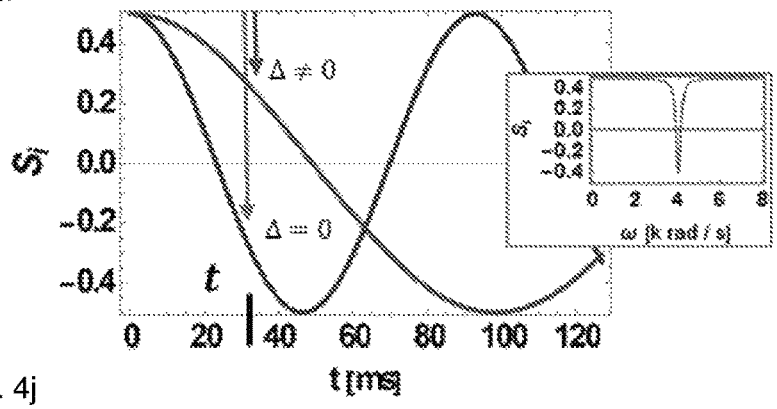
FIG. 4j illustrates the temporal evolution of the sequence on/away from resonance. The signal is obtained by choosing an observation time t and sweeping the frequency ω.

The typical temporal dependence of the signal (FIG. 4j) has a sinusoidal shape, analogous to Rabi oscillations, reflecting the cumulative effect induced by fine driving R pulses on the nuclear spin state. In addition to providing a high quality signal, the presence of selective, slow nuclear evolution in only one half of the probe spin-echo sequence results in a characteristic detuning behaviour. As $\Delta_\pm$ increases, the frequency of the signal decreases, while the maximum amplitude remains unchanged, as illustrated by FIG. 4j. This is particularly useful for the generation of a clean signal trace as a function of fine frequency $\omega$ at a fixed time t, providing an effective Lorentzian signal peak.

For the decoupled nuclear spins in the equally mixed spin state and $T_{2n}>t$, the total signal for all nuclei can be expressed as a product of individual signals originating from each nuclei:

$$S(\omega, \theta, \phi, t, B_w) = \prod_{i=1}^{N} S_i(\omega, \theta, \phi, t, B_w)e^{-t/T_{2p}}, \tag{7}$$

where N is the total number spins of the species we wish to sense and $T_{2p}$ is the transverse coherence time of the probe spin.

Based on the outlined methodology a multitude of control protocols can be derived with variations in the nuclear decoupling and probe detection sequences. In case of decoupling sequences of other families that have less or no free procession periods, the control rotation R pulses can be applied simultaneously with any decoupling pulse provided the two commute.

An additional feature of the control sequence is the positive effect on the probe's coherence time $T_{2p}$. By suppressing the coupling between the nuclei, the protocol simultaneously modifies the intrinsic fluctuation spectra of the molecule, its frequency spread is reduced to a narrow band around a single high frequency ($1/\tau$), that is outside the defection range of the probe sensing protocol. This property opens up a noise free window in low frequency spectrum, which is particularly suitable for high resolution detection of remote nuclear spins.

Measurement and Processing

This following description details the general steps as performed by readout module 108 leading to the generation of the 3D spatial image of molecular nuclear density.

Figure 5:
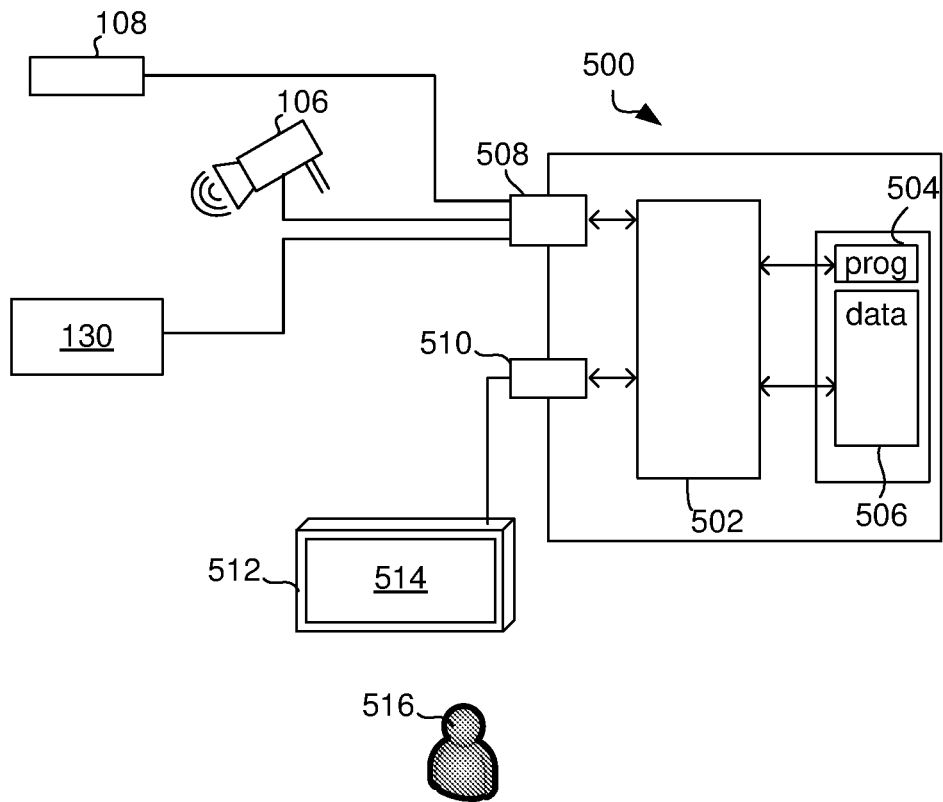
FIG. 5 illustrates a computer system for determining a spatial configuration of multiple nuclei.

FIG. 5 illustrates a computer system 500 for determining a spatial configuration of multiple nuclei. The computer system may be integrated into readout module 108 or connected to readout module 108 as shown in FIG. 5. Throughout this disclosure, any steps performed by readout module 108 may be performed by computer system 500 and vice versa.

The computer system 500 comprises a processor 502 connected to a program memory 504, a data memory 506, a communication port 508 and a user port 510. The communication port 508 may be split into multiple separate ports, such as an input port and an output port but for simplicity it is described here as a single input/output port 508.

Figure 6:
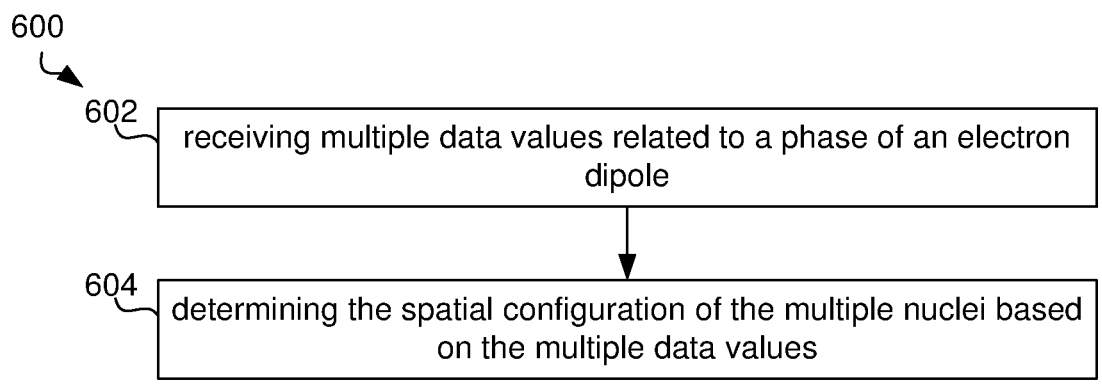
FIG. 6 illustrates a computer implemented method for determining a spatial configuration of multiple nuclei.

The program memory 504 is a non-transitory computer readable medium, such as a hard drive, a solid state disk or CD-ROM. Software, that is, an executable program stored on program memory 504 causes the processor 502 to perform a computer implemented method as illustrated in FIG. 6, that is, processor 502 receives 602 multiple data values related to a phase of an electron dipole. Each data value is associated with one of multiple spatial configurations of a magnetic field generated by the electron dipole and with one of multiple first signal frequencies. Each data value is indicative of a number of nuclei that are resonant at the associated first signal frequency. Processor 502 then determines 604 the spatial configuration of the multiple nuclei based on the multiple data values, the multiple spatial configurations and the multiple first signal frequencies.

The term "determining a spatial configuration" refers to calculating one or more values that are indicative of the spatial configuration, such as spin density values associated with three-dimensional coordinates.

The processor 502 may then store the spatial configuration on data store 506, such as on RAM or a processor register. Processor 502 may also send the determined spatial configuration via communication port 508 to a server, such as molecule database.

The processor 502 may receive data, such as dipole phase data, from data memory 506 as well as from the communications port 508 and the user port 510, which is connected to a display 512 that shows a visual representation 514 of the spatial configuration to a user 516. In one example, the processor 502 receives dipole phase data from readout module 108 via communications port 508, such as by using a Wi-Fi network according to IEEE 802.11. The Wi-Fi network may be a decentralised ad-hoc network, such that no dedicated management infrastructure, such as a router, is required or a centralised network with a router or access point managing the network.

In one example, the processor 502 receives and processes the dipole phase data in real time. This means that the processor 502 determines the spatial configuration or an aspect of the spatial configuration every time dipole phase data is received from readout module 108 and completes this calculation before the readout module 108 sends the next dipole phase update.

Although communications port 508 and user port 510 are shown as distinct entities, it is to be understood that any kind of data port may be used to receive data, such as a network connection, a memory interface, a pin of the chip package of processor 502, or logical ports, such as IP sockets or parameters of functions stored on program memory 504 and executed by processor 502. These parameters may be stored on data memory 506 and may be handled by-value or by-reference, that is, as a pointer, in the source code.

The processor 502 may receive data through all these interfaces, which includes memory access of volatile memory, such as cache or RAM, or non-volatile memory, such as an optical disk drive, hard disk drive, storage server or cloud storage. The computer system 500 may further be implemented within a cloud computing environment, such as a managed group of interconnected servers hosting a dynamic number of virtual machines.

It is to be understood that any receiving step may be preceded by the processor 502 determining or computing the data that is later received. For example, the processor 502 determines a dipole phase and stores the dipole phase as digital data values in data memory 506, such as RAM or a processor register. The processor 502 then requests the data from the data memory 506, such as by providing a read signal together with a memory address. The data memory 506 provides the data as a voltage signal on a physical bit line and the processor 502 receives the dipole phase via a memory interface.

It is to be understood that throughout this disclosure unless stated otherwise, nodes, edges, graphs, solutions, variables and the like refer to data structures, which are physically stored on data memory 506 or processed by processor 502. Further, for the sake of brevity when reference is made to particular variable names, such as "dipole phase" or "spatial configuration" this is to be understood to refer to values of variables stored as physical data in computer system 500.

FIG. 6 is to be understood as a blueprint for a control software program and may be implemented step-by-step, such that each step in FIG. 6 is represented by a function in a programming language, such as Matlab, C++ or Java. The resulting source code is then compiled and stored as computer executable instructions on program memory 504.

The determination of the spatial configuration in form of a 3D image will now be described in more detail. Processor 502 performs the primary sampling by sweeping the fine driving frequency $\omega$ in discrete steps $d\omega$ from $f_{min}$ to $\omega_{max}$. The upper frequency limit $\omega_{max}$ is set by the value of the interaction at the substrate surface, immediately below the molecule. The lower frequency bound $\omega_{min}$ is no greater than the minimal coupling experienced in the molecule, spatially associated with the uppermost part of the molecule.

Relative to the probe, the physical shape of a resonant interaction surface is defined by a equipotential (110/112 in FIG. 1) of the coupling field between the probe and the nuclei having value equal to $\omega$. In frequency space, the spectral broadening of the signal generated by the power of the driving field $B_\omega$ is set equal the sampling step $d\omega$, ensuring sufficient spectral coverage. In real space, the cross-section width of the interaction surface is non-uniform and depends on the gradient of coupling field, however, the sampling coverage set in the frequency domain translates to real space.

The signal values from readout module 108 generated by the frequency sweep contain relative information about the number of nuclear spins located on each of the interaction surfaces. In other words, system 100 performs the steps of generating the first signal multiple times at respective multiple first signal frequencies. Processor 502 determines the phase of the electron dipole for each of the multiple first signal frequencies such that each of the multiple phases is associated with one of the multiple first signal frequencies. Processor 502 can then determine the spatial configuration based on the multiple phases and the multiple first signal frequencies ω.

The orientation of the interaction surfaces depends on the direction of the quantisation axis (FIG. 4a). The frequency sampling is performed for multiple orientations of the quantization axis by reorienting the background magnetic field $B_0(\theta,\phi)$, in discrete co-latitude steps of $d\theta$ from $\theta_{min}$ to $\theta_{max}$ and azimuth steps of $d\phi$ from 0 to $2\pi$. In other words the steps of generating 154 the first signal and determining 156 the phase of the electron dipole are repeated multiple times for respective multiple spatial adjustments of the magnetic field generated by the electron dipole to determine multiple phases such that each of the multiple phases is associated with one of the multiple spatial adjustments. Processor 502 then determines the spatial configuration comprises determining the spatial configuration based on the multiple phases and the multiple spatial adjustments.

Combining the above repetitions, system 100 may repeat the process for combinations of signal frequencies and magnetic field, that is, system 100 performs the steps of generating 154 the first signal and determining 156 the phase of the electron dipole multiple times for respective multiple pairs of first signal frequency and spatial adjustment of the magnetic field generated by the electron dipole to determine multiple phases. Each of the multiple phases indicative of a number of nuclei that are resonant at the first signal frequency is associated with one of the multiple pairs of first signal frequency and spatial adjustment. Processor 502 then determines the spatial configuration based on the multiple phases and the multiple pairs of first signal frequency and spatial adjustment.

The signal for each resonant surface is a product of individual nuclear spin signals. This characteristic is considered both from sampling and from data processing perspectives. As a function of time, the signal approaches zero more quickly as the number of spins on a resonate surface increases. An appropriate choice of the fine driving strength $B_\omega$ and the sequence length t is made. To yield optimal results processor 502 optimised this calibration dynamically for a particular molecule of interest as part of the intimal frequency sweep. Alternatively, processor 502 can perform the sampling for several sequence lengths.

Given the signal product structure processor 502 uses a self-scaled derivative (SSD) approach to linearization. The SSD, $S^*_i(x)$ of a single signal function, $S_i(x)$, may be defined with respect to some variable x as:

$$S^*_i(x) = \frac{1}{S_i(x)} \frac{\partial S_i(x)}{\partial x}, \quad (8)$$

As the total signal is a product of signals of all N nuclei in the molecule, it follows that the SSD of the total signal with respect to a variable x transforms from product to sum based structure:

$$S^*(x) = \sum_{i=1}^{n} S^*_i(x). \quad (9)$$

The data is linearized by computing the self scaled derivative for each frequency sweep with respect to the fine driving frequency ω. Processor 502 may perform a one dimensional deconvolution of the frequency-sweep data as follows. One choice for the point spread function is the single nuclei spin response SSD function, $S^*_i$, symmetrically centred in the sweep range. The deconvolution step removes signal contributions of the spins on the neighbouring interaction surfaces, ensuring that data linearly reflects the number of spins present at their corresponding surface. In other words, the following deconvolution process accounts for multiple contributions of the same nucleus to each point of the output space and therefore eliminates double counting of nuclei.

In order to form the nuclear density image, the volume containing the molecule is discretised into n×m×q segments separated by a dl step. Processor 502 constructs a transform $\underline{M}$ such that $\underline{S}=\underline{M}\cdot\underline{\rho}$ where ρ is a vectorised 3D nuclear density, and $\underline{S}$ is the equivalent form of the measured signal for all surface ordinations. Each row of the matrix $\underline{M}$ represents a 3D binary map corresponding to a single interaction surface. Processor 502 obtains the nuclear spin density by numerical inversion. This general approach is unconstrained by the shape of the resonate surface. From the 3D density image, processor 502 extracts atomic coordinates by observing the positions of the local maxima.

Example—imaging the Rapamycin molecule ($C_{51}H_{79}NO_{13}$)

Figure 7A:
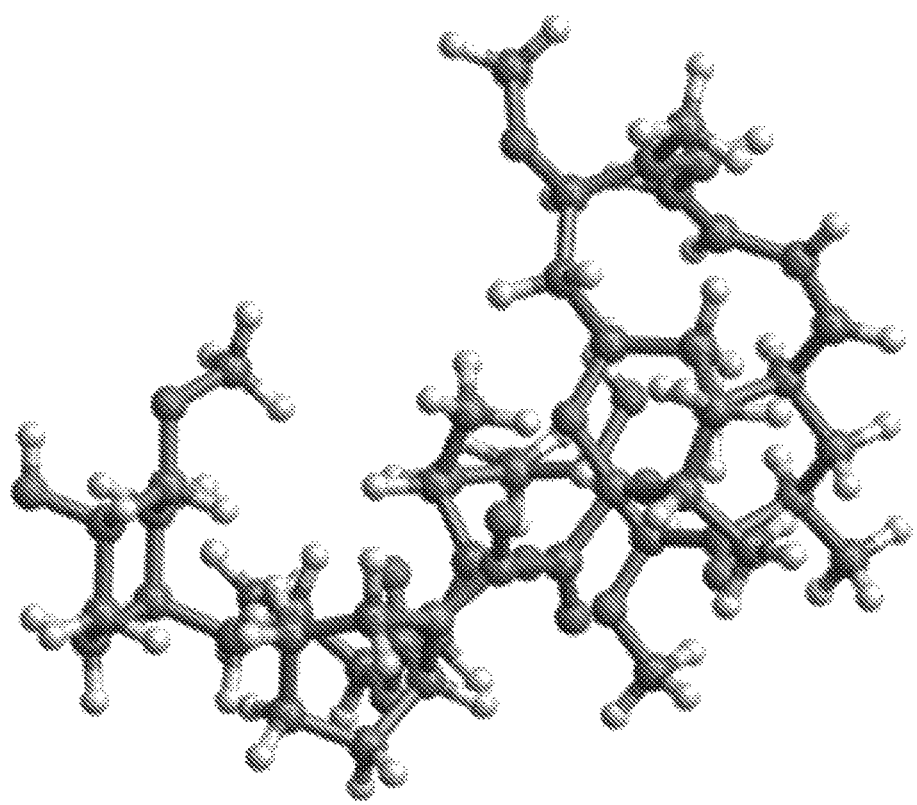
FIG. 7a illustrates a ball-and-stick model of Rapamycin.

We illustrate the theory by a non-trivial example—the Rapamycin molecule in the mass range ~1 kDa as shown in FIG. 7a. This particular molecule is around three orders of magnitude larger than that proposed for 1D and 2D NMR spectroscopic approaches. However, in our approach it is still manually tractable and requires modest computational resources to simulate the protocol. For reasonable choices of quantum probe coherence parameters, we demonstrate how the $H^1$ and $C^{13}$ nuclear densities are imaged, and the molecular coordinates for the two atomic species determined.

For clarity, the method is demonstrated for a probe with a well localised electronic spin, thus the interaction surfaces correspond to equipotential surfaces of the secular dipole-dipole coupling field:

$$k(r_{\theta,\phi}) = \gamma_e \gamma_n \frac{\hbar\mu_0}{4\pi} \frac{1}{r_{q,\phi}^3}\left(1 - 3\frac{z_{\theta,\phi}^2}{r_{\theta,\phi}^2}\right), \quad (10)$$

where $r_{\theta,\phi}$ and $z_{\theta,\phi}$ is the coordinate vector and its z projection with respect to quantisation axis of polar direction (θ,φ).

The parameters chosen are as follows. The fine frequency sweeping range was $\omega_{min}=100$ Hz, $\omega_{max}=15$ kHz with the sampling step of $d\omega=100$ Hz. The frequency sweeps were conducted for a range of orientations as given by co-latitude parameters $\theta_{min}=\pi/24$, $\theta_{max}=11\pi/24$, and $d\theta=\pi/24$ and longitude steps $d\phi=\pi/12$. Each point was sampled at a fixed protocol length of $t_H=8$ ms for $H^1$ nuclei and $t_{C^{13}}=16$ ms for $C^{13}$ nuclei, with M=2000 measurement repetitions. The transverse coherence time of the probe and the effective coherence time of the nuclear spins were set to be respectively $T_{2p}=100$ ms and $T_{2n}=50$ ms. Such coherence times are already established for the Si:P system, and with suitable cooling and material improvements may be possible for the NV centre.

Figure 7B:
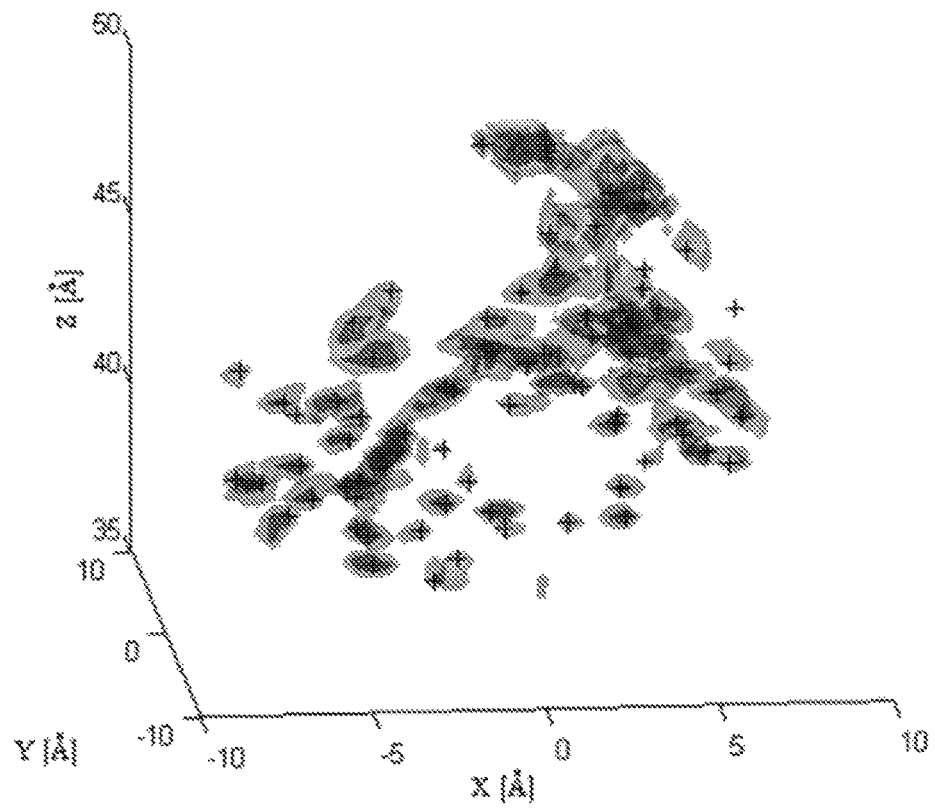
FIG. 7b illustrates the obtained image of the hydrogen nuclear density, crosses indicated the local maxima in density.
Figure 7C:
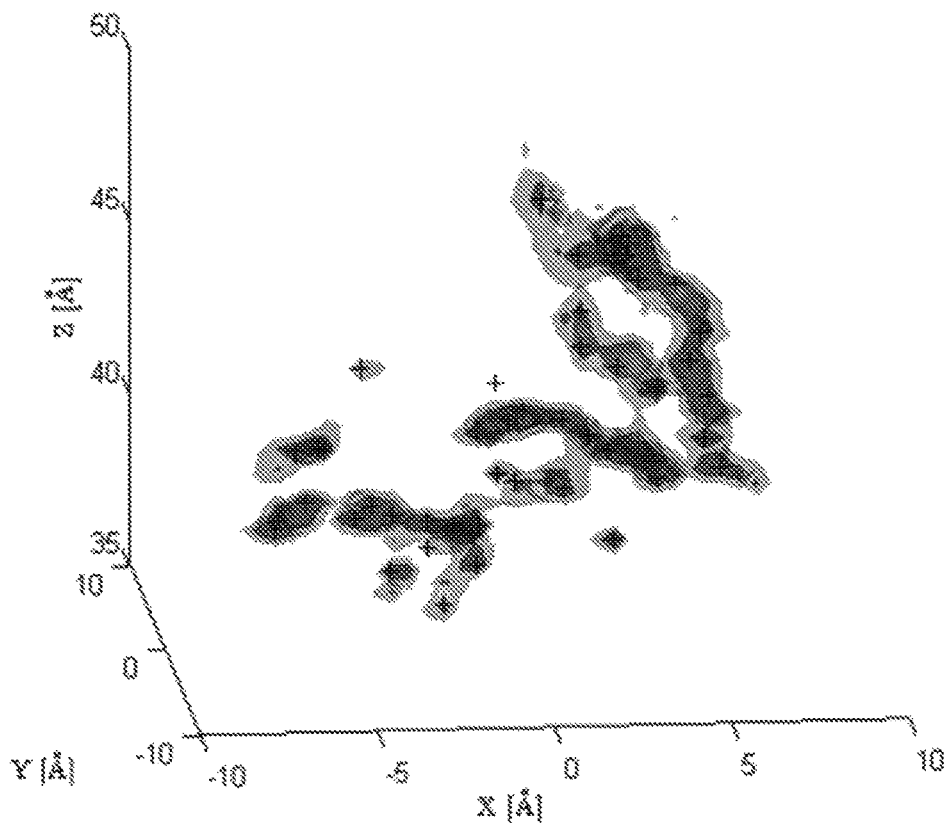
FIG. 7c illustrates the obtained nuclear density of carbon 13.

To obtain nuclear density images in 3D, the region around the molecule, x(−1,1) nm, y(−1,1) nm and z(3.5,5) nm was discretised in cubic voxel of side length dl=0.5 Å, the signal mapping and inversion was done by numerical least-square inversion as described in: Barrett, R., M. Berry, T. F. Chan, et al., "Templates for the Solution of Linear Systems: Building Blocks for Iterative Methods", SIAM, Philadelphia, 1994 and Paige, C. C. and M. A. Saunders, "LSQR: An Algorithm for Sparse Linear Equations And Sparse Least Squares," ACM Trans. Math. Soft., Vol. 8, 1982, pp. 43-71, both of which are incorporated herein by reference. With the outlined parameters, the total acquisition time amounts to approximately 336 hours for $H^1$ spins (and twice as long for $C^{13}$ species) assuming each of the N measurements is performed in a single shot. The resulting molecular nuclear 3D densities are shown in FIGS. 7b and 7c and may be displayed on display 514 to user 516 as a graphical representation of the spatial configuration.

Figure 7D:
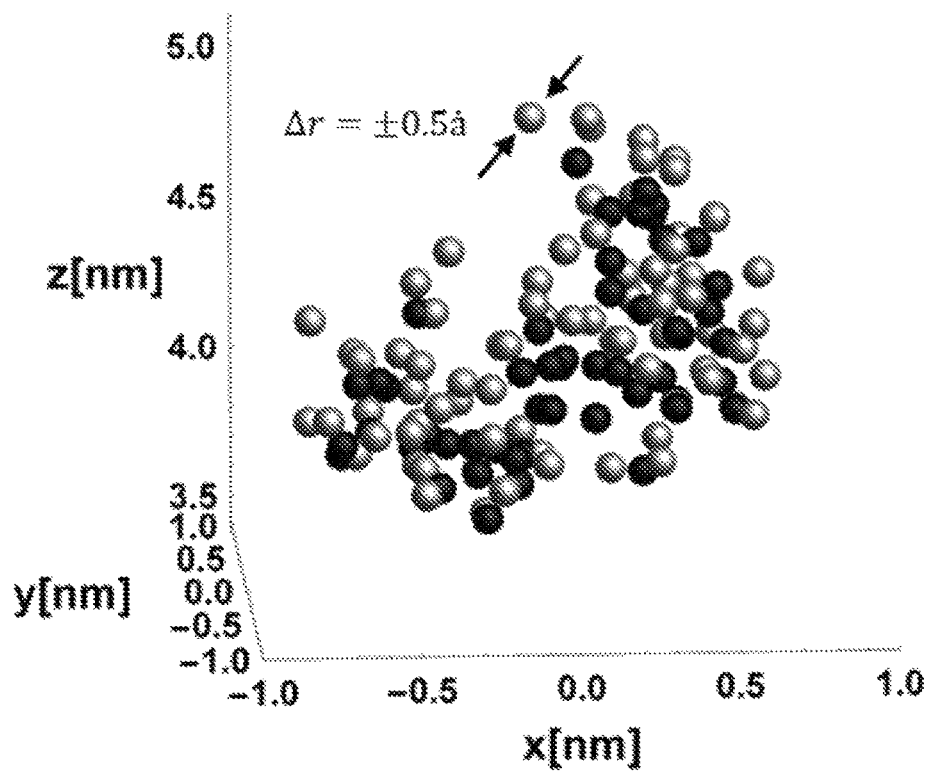
FIG. 7d illustrates a reconstruction of the hydrogen (white) and carbon 13(black) atomic coordinates, the size of spheres corresponds to the average statistical deviation in comparison to the exact coordinates Δr=0.5 å.

FIG. 2D shows the atomic site coordinates, as obtained from the local maxima of the nuclear density images. We note that these coordinates are derived directly from the density image, without potential energy minimisation or any other similar processing. Comparison of the reconstructed atomic coordinates to true molecular coordinates, gives an average statistical variation of 0.5 Å, represented as the radius of the spheres in FIG. 7d, which may be displayed on display 514 to user 516 as a graphical representation of the spatial configuration.

The resolution of the 3D density varies in z-axis, the width of the density peaks ranges from 0.5 Å to 1.5 Å. This behaviour is consistent with the sampling methodology used in this example, as the frequency sweep steps are constant, yet the iteration strength gradient is not.

In one example, the frequency steps and the fine driving field broadening can be set in accordance with the nonlinear rate of change of the probe interaction field, resulting in an efficient coverage of frequency space while keeping the density resolution constant through the entire sampled volume. The method is suited to adaptively sampling, starting from a low resolution density estimate, while iteratively modifying the sampling parameters. In particular, the measurement protocol length can vary in response to the estimate of the density of the probed iteration surface. Also, both the frequency sweeps and orientation of the interaction surfaces can be adapted throughout the measurement in order to reflect the sample molecule's geometry. Such developments can significantly reduce the overall measurement time.

The disclosed imaging method is suitable for molecules considerably larger than the example considered here. In the first instance, such cases will benefit significantly from adaptive sampling. An adequate level of control of both the protocol length and the frequency sweep steps is necessary for molecules >20 kDa, as the rate of signal change form one interaction surface to another can vary more than what is appropriately accounted for by uniform sampling. This behaviour arises from the nonlinear increase in the area of the interaction surfaces. A larger surface can be exposed to a greater number of nuclear spins, producing a steeper signal with respect as a function of protocol length.

Another point is related to the decoupling pulses. The above examples used a conventional solid state NMR decoupling pulse. The performance of such pulse is not a main topic of interest, however their efficiency has a direct effect on the contract of the of the control protocol signal. The magnitude of this effect depends on the shape of the decoherence envelope a particular decoupling sequence produces. In practice, this shape is characterised at the start, with the control rotation R pulses set to off resonance. Together with the intrinsic coherence time of the electronic probe spin, the coherence time of the nuclear spins sets a limit on the spectral solution of the method.

The protocol is developed for the case of a general spin probe—differences between probes arising from their wave functions and degree of localisation are accounted for in the appropriate shape of the interaction surfaces. Probes that have a zero-field splitting (e.g.—NV centre in diamond) are characterised by an offset in the rotation of the interaction surfaces relative to the background field, and once the control over the surfaces is characterised, the same reconstruction methodology follows.

Disclosed herein is an Angstrom-level MRI molecular microscope system based on a quantum spin probe for the determination of structure at the single-molecule level. The quantum probe acts as both MRI sensor and gradient field, encoding the target's real-space spin density in frequency space. By performing multiple measurements on the quantum probe over many positions and orientations of the probe-target interaction surfaces, the system acquires detailed information about the nuclear spin density in the target molecule.

After the deconvolution procedure, processor 502 maps out the nuclear spin density and the atomic co-ordinates determined. The technique, without optimisation, was tested on a non-trivial example—the ~1 kDa Rapamycin molecule ($C_{51}H_{79}NO_{13}$)—using quantum probe coherence parameters already achieved experimentally for the Si:P case. The resolution and average structural errors were found to be at the Angstrom level and below. This example already demonstrated a total structure-determination time well below existing ensemble based methods, however, further improvements and optimisation are expected to greatly reduce the overall acquisition time. The technique could be realised using either NV or Si:P spin probes, and there would appear to be no impediments to scaling to larger biomolecules of interest.

It will be appreciated by persons skilled in the art that numerous variations and/or modifications may be made to the specific embodiments without departing from the scope as defined in the claims. In particular, the multiple probes may be quantum entangled and the probe may perform surface and scanning modes.

The temperature generally relates both to degree of quantum coherence (e.g. for Si:P) and/or to immobilising the target. This means the type of probe may depend on the temperature of the application. In case of imaging biomolecules at a natural temperature, an NV probe may be appropriate due to its inherent stability. For low temperature applications, SiP probes may be preferred.

Processor 502 may perform an initial coarse mapping, i.e. not at the final high resolution, rather grouping clusters of nuclei to get a rough topology of the target. The target may be more than one molecule, e.g. how a drug interacting with a protein. The target may be a lipid bi-layer/membrane with membrane proteins/ion-channels etc.

While the above examples relate to a high background magnetic field, lower field may also be used. For very large molecules where the resolution drops off with distance an additional magnetic field gradient may be applied from a scanning magnetic tip, for example.

Multiple (independent or entangles) probes may be used for very large molecules, and these may be controlled by the same fields.

The nuclei spin systems targets may be other objects than molecules. The nuclear spin of the probe may store the phase accumulated. Processor 502 may generate and apply a higher order quantum control sequences on the probe. The target may be at room temperature but encapsulated to prevent motion.

System 100 may comprise multiple instances of probe 104 and molecule 102 to gather a greater amount of information in parallel, which may lead to a speed up of the overall process.

It should be understood that the techniques of the present disclosure might be implemented using a variety of technologies. For example, the methods described herein may be implemented by a series of computer executable instructions residing on a suitable computer readable medium. Suitable computer readable media may include volatile (e.g. RAM) and/or non-volatile (e.g. ROM, disk) memory, carrier waves and transmission media. Exemplary carrier waves may take the form of electrical, electromagnetic or optical signals conveying digital data steams along a local network or a publically accessible network such as the internet.

It should also be understood that, unless specifically stated otherwise as apparent from the following discussion, it is appreciated that throughout the description, discussions utilizing terms such as "estimating" or "processing" or "computing" or "calculating", "optimizing" or "determining" or "displaying" or "maximising" or the like, refer to the action and processes of a computer system, or similar electronic computing device, that processes and transforms data represented as physical (electronic) quantities within the computer system's registers and memories into other data similarly represented as physical quantities within the computer system memories or registers or other such information storage, transmission or display devices.

The present embodiments are, therefore, to be considered in all respects as illustrative and not restrictive.

The invention claimed is:

1. A system for determining a spatial configuration of multiple nuclei, the system comprising:
   an electron dipole to generate a spatially varying magnetic field such that each of the multiple nuclei is resonant at a respective resonance frequency defined by the magnetic field at a location of that nucleus;
   a first signal generator to generate a first signal at a first signal frequency such that, as a result of dipole-dipole interaction between the electron dipole and a subset of the multiple nuclei that are resonant at the first signal frequency, a phase of the electron dipole is indicative of a number of nuclei that are resonant at the first signal frequency and to generate the first signal multiple times at respective multiple first signal frequencies; and
   a readout module
      to determine the phase of the electron dipole for each of the multiple first signal frequencies to determine multiple phases, wherein each of the multiple phases is associated with one of the multiple first signal frequencies, and
      to determine the spatial configuration of the multiple nuclei based on the multiple phases of the electron dipole and the multiple first signal frequencies.

2. The system of claim 1, wherein the electron dipole is one of:
   a nitrogen vacancy qubit; and
   a SiP qubit.

3. The system of claim 1, further comprising a second signal generator to generate a second signal that decouples the multiple nuclei from each other to reduce interaction between the nuclei.

4. The system of claim 3, wherein the second signal is spectrally broad to decouple all of the multiple nuclei from each other while the first signal is spectrally narrow to bring only the subset of the multiple nuclei into resonance.

5. The system of claim 3, wherein the first signal comprises multiple first pulses and the second signal comprises multiple second pulses and the multiple first pulses and multiple second pulses are interleaved.

6. The system of claim 1, wherein the system further comprises a field generator to generate a magnetic control field to spatially adjust the spatially varying magnetic field generated by the electron dipole.

7. The system of claim 1, wherein the system further comprises one or more further electron dipoles to generate the spatially varying magnetic field such that each of the multiple nuclei is resonant at a respective resonance frequency defined by the magnetic field at a location of that nucleus.

8. The system of claim 7, wherein the electron dipoles are entangled.

9. A method for determining a spatial configuration of multiple nuclei, the method comprising:
   arranging an electron dipole in close proximity to the multiple nuclei such that the electron dipole generates a spatially varying magnetic field and each of the multiple nuclei is resonant at a respective resonance frequency defined by the magnetic field at a location of that nucleus;
   generating a first signal at a first signal frequency such that, as a result of dipole-dipole interaction between the electron dipole and a subset of the multiple nuclei that are resonant at the first signal frequency, a phase of the electron dipole is indicative of a number of nuclei that are resonant at the first signal frequency and performing the step of generating the first signal multiple times at respective multiple first signal frequencies;
   determining the phase of the electron dipole for each of the multiple first signal frequencies to determine multiple phases wherein each of the multiple phases is associated with one of the multiple first signal frequencies; and
   determining the spatial configuration of the multiple nuclei based on the multiple phases of the electron dipole and the multiple first signal frequencies.

10. The method of claim 9, wherein generating the first signal comprises generating the first signal to rotate the multiple nuclei in relation to the electron dipole.

11. The method of claim 9, further comprising generating a second signal to decouple the multiple nuclei from each other to reduce interaction between the nuclei.

12. The method of claim 9, further comprising controlling a wave function of the electron dipole to modify the dipole-dipole interaction between the electron dipole and the subset of the multiple nuclei.

13. The method of claim 9, further comprising generating a magnetic control field to spatially adjust the spatially varying magnetic field generated by the electron dipole.

14. The method of claim 13, wherein
   the method further comprises performing the steps of generating the first signal and determining the phase of the electron dipole multiple times for respective multiple spatial adjustments of the magnetic field generated by the electron dipole to determine multiple phases such that each of the multiple phases is associated with one of the multiple spatial adjustments; and determining the spatial configuration comprises determining the spatial configuration based on the multiple phases and the multiple spatial adjustments.

15. The method of claim 12, wherein the method further comprises performing the steps of generating the first signal and determining the phase of the electron dipole multiple times for respective multiple pairs of first signal frequency and spatial adjustment of the magnetic field generated by the electron dipole to determine multiple phases such that each of the multiple phases indicative of a number of nuclei that are resonant at the first signal frequency is associated with one of the multiple pairs of first signal frequency and spatial adjustment; and determining the spatial configuration comprises determining the spatial configuration based on the multiple phases and the multiple pairs of first signal frequency and spatial adjustment.

16. The method of claim 15, wherein determining the spatial configuration comprises mapping the number of nuclei associated with each of the multiple pairs of first signal frequency and spatial adjustment to an output coordinate system.

17. The method of claim 16, wherein mapping the number of nuclei associated with each of the multiple pairs of first signal frequency and spatial adjustment to the output coordinate system comprises linearizing the multiple phases with respect to the first signal frequency to determine a linearized phase; and determining the spatial configuration based on the linearized phase.

18. The method of claim 9, wherein determining the spatial configuration comprises determining the number of nuclei at each point of an output space by accounting for multiple contributions of the same nucleus to each point of the output space.

19. The method of claim 17, wherein determining the spatial configuration comprises performing a de-convolution of the linearized phase to determine a spin density for each of multiple voxels as the spatial configuration of the multiple nuclei.

20. A computer system for determining a spatial configuration of multiple nuclei, the computer system comprising:

an input port to receive phase measurements of an electron dipole;

an output port to send a command to a first signal generator, and a processor to determine a first signal frequency and a first signal at the first signal frequency such that, as a result of dipole-dipole interaction between the electron dipole and a subset of the multiple nuclei that are resonant at the first signal frequency, a phase of the electron dipole is indicative of a number of nuclei that are resonant at the first signal frequency and to determine the first signal multiple times at respective multiple first signal frequencies, to send over the output port a command to the first signal generator to generate the first signal at the first signal frequency, to receive a phase measurement of the electron dipole through the input port for each of the multiple first signal frequencies to receive multiple phase measurements, wherein each of the multiple phase measurements is associated with one of the multiple first signal frequencies, and to determine the spatial configuration of the multiple nuclei based on the multiple phase measurements and the multiple first signal frequencies.

21. A computer implemented method for determining a spatial configuration of multiple nuclei, the method comprising:

determining a first signal frequency and a first signal at the first signal frequency such that, as a result of dipole-dipole interaction between an electron dipole and a subset of the multiple nuclei that are resonant at the first signal frequency, a phase of the electron dipole is indicative of a number of nuclei that are resonant at the first signal frequency and determining the first signal multiple times at respective multiple first signal frequencies, repeatedly sending over an output port a command to a first signal generator to generate the first signal at each of the multiple first signal frequencies, receiving a phase measurement of the electron dipole through an input port for each of the multiple first signal frequencies to receive multiple phase measurements, wherein each of the multiple phase measurements is associated with one of the multiple first signal frequencies, and determining the spatial configuration of the multiple nuclei based on the multiple phase measurements and the multiple first signal frequencies.

22. A non-transitory computer readable medium with program code stored thereon that, when executed by a computer, causes the computer to perform the method of claim 21.

* * * * *

UNITED STATES PATENT AND TRADEMARK OFFICE
CERTIFICATE OF CORRECTION

PATENT NO. : 10,830,717 B2
APPLICATION NO. : 15/739689
DATED : November 10, 2020
INVENTOR(S) : Lloyd Hollenberg et al.

It is certified that error appears in the above-identified patent and that said Letters Patent is hereby corrected as shown below:

On the Title Page

Item (72) should be changed to:
-- (72) Inventors: Lloyd Hollenberg, Melbourne (AU); Viktor Perunicic, Melbourne (AU); Charles David Hill, Melbourne (AU) --

Signed and Sealed this
Twenty-seventh Day of September, 2022

Katherine Kelly Vidal
*Director of the United States Patent and Trademark Office*